US008212612B2

United States Patent
Song et al.

(10) Patent No.: US 8,212,612 B2
(45) Date of Patent: Jul. 3, 2012

(54) CLOSED-LOOP CLASS-D AMPLIFIER WITH MODULATED REFERENCE SIGNAL AND RELATED METHOD

(75) Inventors: Jungwoo Song, Irvine, CA (US);
Xicheng Jiang, Irvine, CA (US);
Minsheng Wang, Irvine, CA (US); Todd L. Brooks, Laguna Beach, CA (US)

(73) Assignee: Broadcom Corporation, Irvine, CA (US)

(*) Notice: Subject to any disclaimer, the term of this patent is extended or adjusted under 35 U.S.C. 154(b) by 30 days.

(21) Appl. No.: 12/804,318

(22) Filed: Jul. 19, 2010

(65) Prior Publication Data
US 2012/0013402 A1 Jan. 19, 2012

(51) Int. Cl.
*H03F 3/38* (2006.01)
*H03F 3/217* (2006.01)

(52) U.S. Cl. .......................................... 330/10; 330/251

(58) Field of Classification Search .................... 330/10, 330/251, 207 A
See application file for complete search history.

(56) References Cited

U.S. PATENT DOCUMENTS
6,952,131 B2 * 10/2005 Jeong et al. .................... 330/10
* cited by examiner

*Primary Examiner* — Robert Pascal
*Assistant Examiner* — Khiem Nguyen
(74) *Attorney, Agent, or Firm* — Farjami & Farjami LLP

(57) ABSTRACT

Disclosed is a closed-loop class-D amplifier circuit including a modulated reference signal generator that provides a modulated reference signal in a feed-forward path, where the reference signal is modulated corresponding to an input signal. The closed-loop class-D amplifier circuit further includes a comparator to generate a control signal based on a comparison of the modulated reference signal and a correction signal, which in turn is produced by filtering a combination of the input signal and a feedback signal. The closed-loop class-D amplifier circuit also includes a pulse generator to generate a pulse-width-modulated signal to drive an output stage of the closed-loop class-D amplifier based on the control signal.

28 Claims, 5 Drawing Sheets

CLOSED-LOOP CLASS-D AMPLIFIER WITH MODULATED REFERENCE SIGNAL AND RELATED METHOD

BACKGROUND OF THE INVENTION

1. Field of the Invention

The present invention is generally in the field of electronic circuits and systems. More specifically, the present invention is in the field of class-D amplifier circuits, so called switching power amplifiers.

2. Background Art

Class-D amplifiers, also called switching amplifiers, provide power-efficient amplification, a property that is particularly important for applications in which a battery is used as a power source. Though potentially capable of producing a highly power-efficient amplified signal, conventional class-D amplifiers are often difficult to adapt for mobile audio applications such as cellular and mobile communications applications. Unfortunately, noisy environments in such applications significantly deteriorate the performance of conventional class-D amplifiers.

For example, conventional open-loop class-D amplifiers typically exhibit poor performance, such as a high THD+N ratio or low supply rejection ratio, which effectively prevents these amplifiers from being adopted in high fidelity audio drivers. Closed-loop class-D power amplifier configurations have been developed to address such issues. However, such configurations have been largely unsatisfactory in mobile applications, especially when driving a large signal. In a conventional closed-loop class-D amplifier, loop filter outputs swing with output signal amplitude. If the output signal amplitude is close to the supply voltage rail, a small fluctuation in the supply rail can make the loop filter output voltage hit the rail voltage and the loop can saturate very easily. When the loop saturates, the overall performance of the class-D amplifier degrades significantly and its power driving capability is also seriously diminished. Consequently, conventional closed-loop approaches to addressing the issues of open-loop class-D configurations may themselves undesirably limit the power driving capability of the switching amplifiers and negate one of the key implementational advantages of switching amplifier technology.

Accordingly, there is a need to overcome the drawbacks and deficiencies of the conventional art by providing a high performance closed-loop class-D amplifier circuit displaying enhanced supply rejection and performance, which is suitable for implementation as an audio amplifier in a mobile communications device.

SUMMARY OF THE INVENTION

The present application is directed to a closed-loop class-D amplifier with modulated reference signal and related method, substantially as shown in and/or described in connection with at least one of the figures, as set forth more completely in the claims.

DETAILED DESCRIPTION OF THE INVENTION

Figure 1:
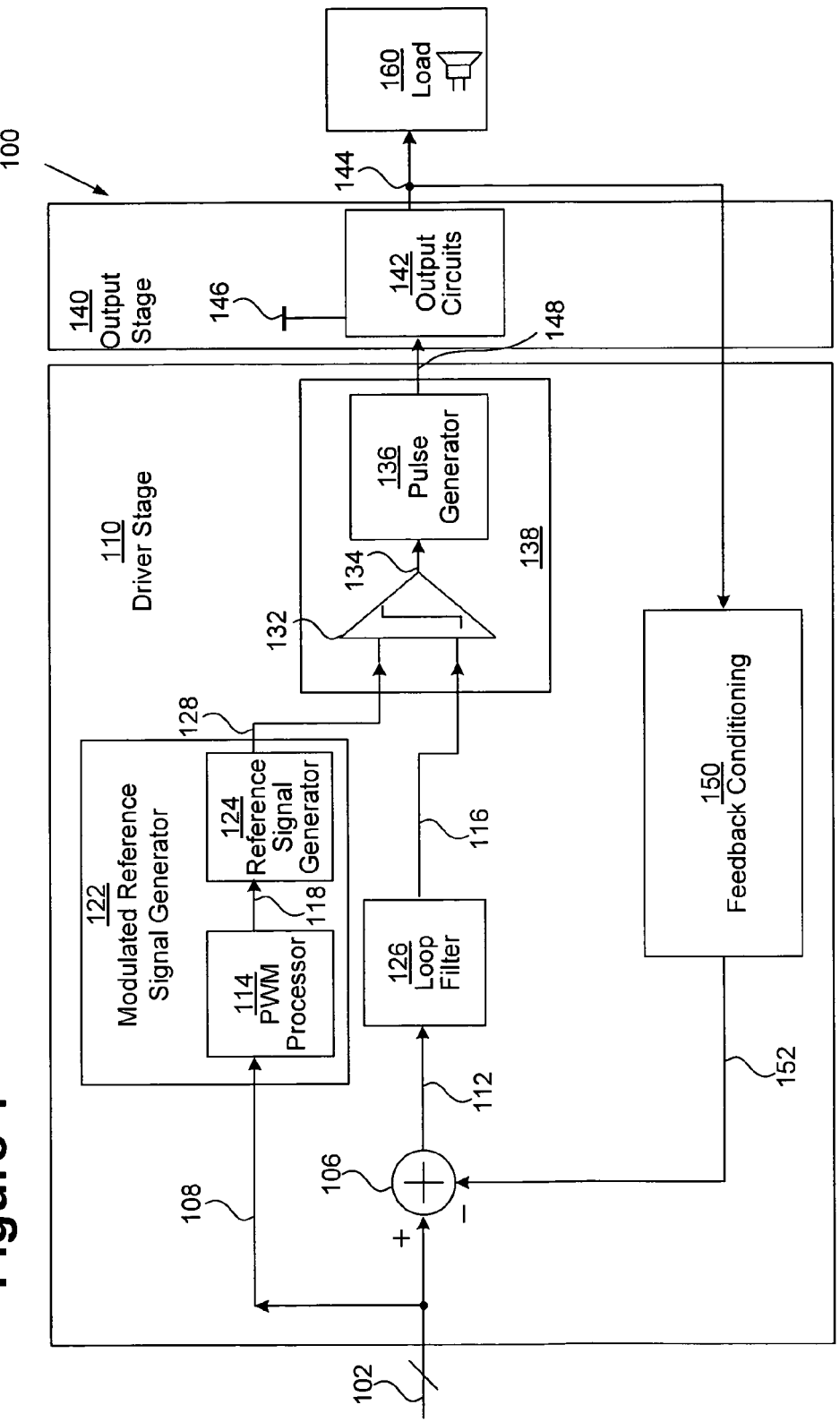
FIG. 1 shows a conceptual block diagram of an exemplary class-D amplifier implemented as an audio amplifier, according to one embodiment of the present invention.

The present invention is directed to a closed-loop class-D amplifier with modulated reference signal and related method. Although the invention is described with respect to specific embodiments, the principles of the invention, as defined by the claims appended herein, can obviously be applied beyond the specifically described embodiments of the invention described herein. Moreover, in the description of the present invention, certain details have been left out in order to not obscure the inventive aspects of the invention. The details left out are within the knowledge of a person of ordinary skill in the art.

The drawings in the present application and their accompanying detailed description are directed to merely exemplary embodiments of the invention. To maintain brevity, other embodiments of the invention, which use the principles of the present invention are not specifically described in the present application and are not specifically illustrated by the present drawings. It should be borne in mind that, unless noted otherwise, like or corresponding elements among the figures are indicated by like or corresponding reference numerals. Moreover, the drawings and illustrations in the present application are generally not to scale, and are not intended to correspond to actual relative dimensions.

Class-D amplifiers typically include a driver stage that translates an input signal into a width-modulated pulse signal, and an output stage that includes a plurality of transistors operating as switches. While conventional class-D amplifiers are more efficient than their linear counterparts, their use in mobile applications including cellular and mobile audio applications can be associated with serious shortcomings.

For example, conventional open-loop class-D amplifiers, which do not employ feedback control in the driver stage, are susceptible to power supply noise and poor performance parameters, such as poor total harmonic distortion (THD) and noisy outputs. Unfortunately, conventional closed-loop class-D amplifiers, which employ a feedback loop to control the driver outputs, only partially addresses the issues associated with the open-loop configurations. In conventional closed-loop class-D amplifiers, loop filter saturation can happen quite easily as the input signal amplitude, and correspondingly the output signal amplitude, increases. If that happens, the amplifier's performance drops and its power drive capability is also limited far below the maximum capability of an open-loop class-D amplifier, which undermines key implementational advantages of switching amplifier technology.

Many of these problems are exacerbated in mobile applications that are characterized by significant supply voltage fluctuation. As a result, in many mobile audio applications, it is often difficult to connect a conventional class-D amplifier directly to the battery while maintaining acceptable performance levels.

The issues associated with conventional closed-loop class-D amplifiers can be addressed by modulating reference signals used to modulate pulse width inside the loop. Conventionally fixed period saw-tooth or triangular signals are used as reference signals to generate pulse-width modulated signals in open-loop and in closed-loop configurations. If reference signals of fixed period are used inside the loop of closed-loop configurations, the loop filter output swings with output signal amplitude and can approach the supply voltage rail as output signal swings grow, hitting the rail voltage while the output amplitude is still far below the maximum available level. Also supply rail fluctuation, which is very common in mobile applications, can make the loop filter outputs hit the rail even though the loop filter outputs are far below the supply voltage rail. The loop saturates easily if the loop filter outputs hit the rail voltage, leading to significant drops in all aspects of the performances of the closed-loop class-D amplifier.

This problem can be overcome by modulating reference signals with input amplitude instead of using references of fixed period or frequency. The loop filter output swings can be kept small if modulated reference signals are used to generate width-modulated pulse signals, which can effectively solve the loop saturation issues associated with conventional closed-loop class-D amplifiers.

FIG. 1 shows class-D amplifier 100, which embodies the present inventive concepts and can provide high performance despite a wide range of supply voltage fluctuations, by keeping loop filter output swings low enough to prevent early loop saturation. Class-D amplifier 100 provides an amplified version of input signal 102, to load 160. As shown in FIG. 1, class-D amplifier 100 may comprise driver stage 110 and output stage 140.

Driver stage 110 of class-D amplifier 100 may include a feed-forward path to produce a modulated reference signal. More specifically, class-D amplifier 100 may comprise modulated reference signal generator 122, which receives input signal 102 via feed-forward path 108. Modulated reference signal generator 122 may internally include Pulse-width-modulation (PWM) processor 114 and reference signal generator 124.

On the input end of modulated reference signal generator 122, an optional processor such as PWM processor 114 may condition input signal 102 to produce feed-forward control signal 118. For example, if digital conditioning of input signal 102 is required, PWM processor 114 may include an analog-to-digital converter (ADC) and digital signal-processing circuitry to ensure that feedforward control signal 118 is a digital PWM representation of input signal 102. Alternatively, if analog signal conditioning is required, PWM processor 114 may comprise circuitry to keep feed-forward control signal 118 as an analog PWM representation of input signal 102. On the output end of modulated reference signal generator 122, reference signal generator 124 may comprise circuitry to produce a modulated reference signal 128 such as modulated saw-tooth or triangular waves, for example, which may be supplied to drive block 138.

In addition to feed-forward path 108, driver stage 110 may also include a feedback path. As shown in FIG. 1, the feedback path of driver stage 110 may comprise feedback conditioning block 150, which can sense output signals reflecting supply noise at output node 144. Feedback conditioning block 150 may process the output signals of class-D amplifier 100 so as to render them acceptable to summer 106 and loop filter 126, if the output signals are not acceptable directly due to a high slew rate, glitch, or noise, for example. Feedback conditioning block 150 can comprise a low pass filter, for example, or simply a direct feedthrough path to summer 106. Feedback conditioning block 150 may return such processed output signals to summer 106 for subsequent processing through a main loop correction path of class-D amplifier 100.

The main loop correction path of driver stage 110 may comprise summer 106 to produce an adjusted input signal such as adjusted signal 112 from a combination of input signal 102 and feedback signal 152. As further shown, loop filter 126, which can be an analog loop filter, for example, may filter adjusted signal 112 into correction signal 116. Loop filter 126 can comprise an integrator or chain of integrators, for example. As shown in FIG. 1, correction signal 116 may be provided as input into drive block 138.

Drive block 138 of driver stage 110 may include comparator 132 and pulse generator 136. As shown in FIG. 1, comparator 132 may generate control signal 134 based on a comparison of modulated reference signals 128 and correction signal 116. Pulse generator 136 may include logic circuitry to store a phase or state corresponding to control signal 134. Pulse generator 136 may also be configured to change the value of drive signal 148 passed to output stage 140 based on the phase or state of control signal 134.

Class-D amplifier 100 may further include output stage 140. As shown, output stage 140 may comprise output circuit 142 and power source 146. Output circuit 142 may comprise a plurality of power transistors such as power metal-oxide-semiconductor field-effect transistors (MOSFETs). The power transistors may be placed in a switching configuration such as a full-bridge or a half-bridge configuration to amplify a modulated input signal. Power source 146 may be a battery, for example, or other power source. Consistent with embodiments of the present invention, power source 146 may be directly connected to output circuit 142 to drive load 160. Load 160 may be driven by a pulse-width-modulated signal from class-D amplifier 100. As indicated in FIG. 1, load 160 may be a transducer like an audio speaker or a mobile electronic component such as a small high-fidelity headset or a cellular or mobile audio system, for example.

Figure 2:
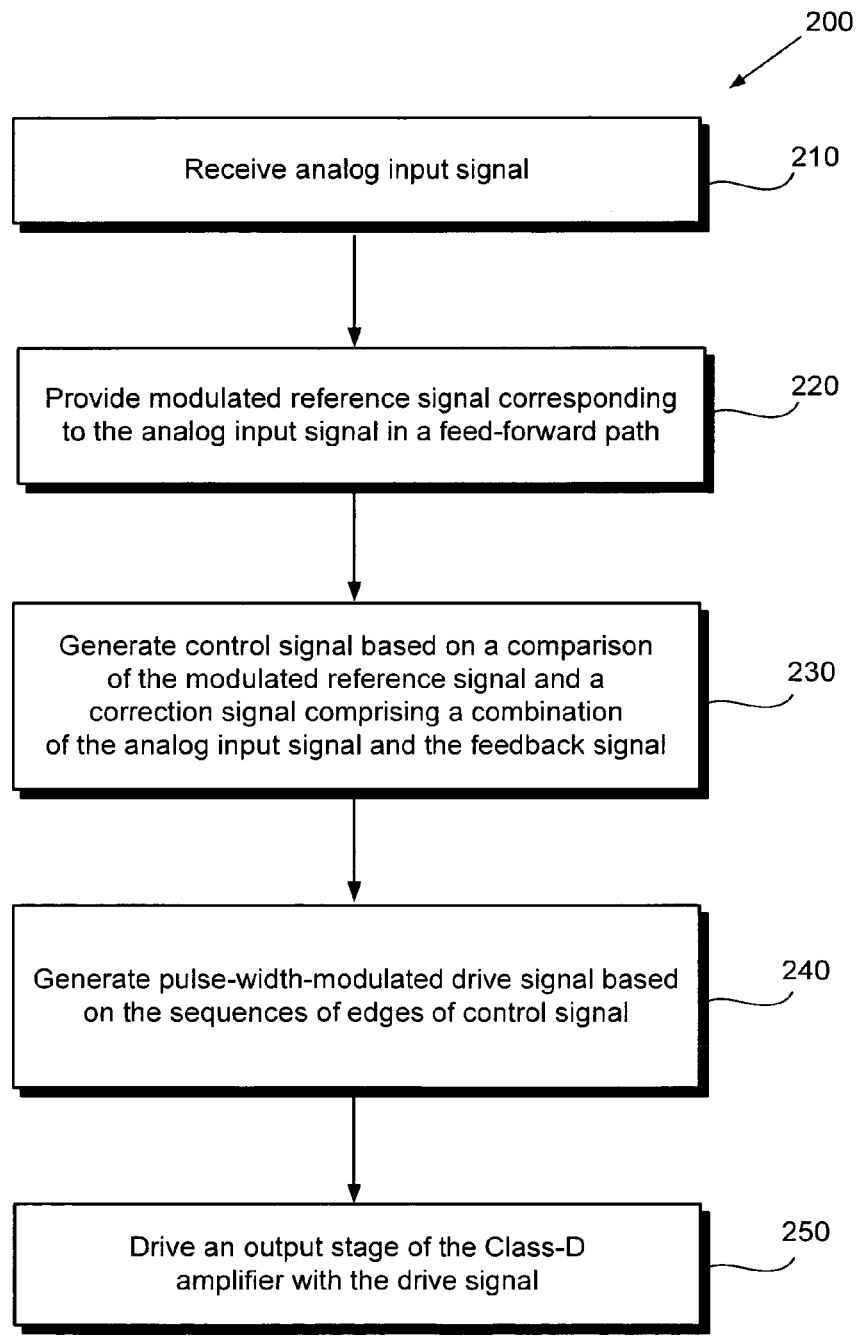
FIG. 2 is a flowchart presenting a method for controlling driver and output stages of a class-D amplifier, according to one embodiment of the present invention.
Figure 3A:
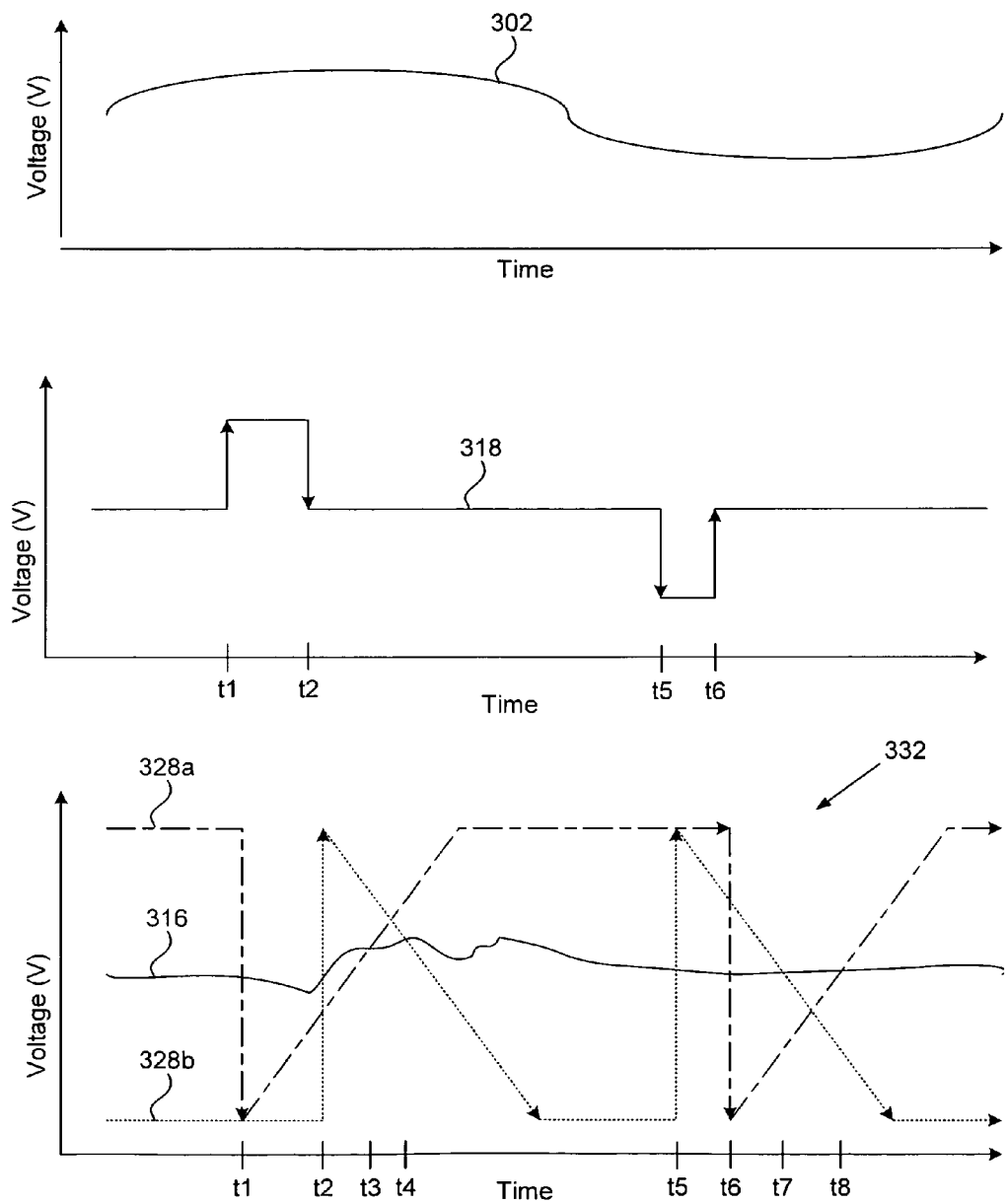
FIG. 3A is a timing diagram showing signal variations within an exemplary class-D amplifier circuit, according to one embodiment of the present invention.
Figure 3B:
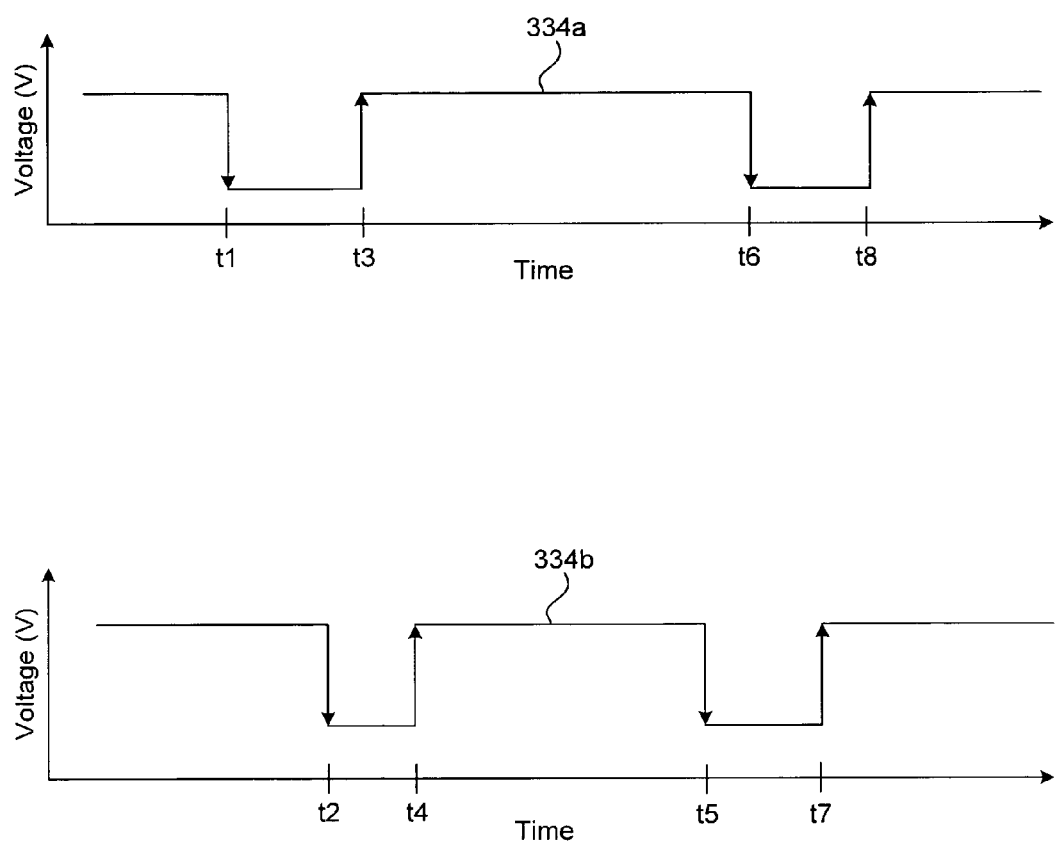
FIG. 3B is a timing diagram showing control signal variations within an exemplary class-D amplifier circuit, according to one embodiment of the present invention.

The operation of the exemplary embodiment of class-D amplifier 100 illustrated in FIG. 1 will be further described with reference to FIGS. 2, 3A, 3B and 4. FIG. 2 describes the steps, according to one embodiment of the present invention, of a method for generating a PWM drive signal in a closed-loop class-D amplifier. FIG. 3A shows exemplary signal variations within class-D amplifier 100, while FIG. 3B shows exemplary control signal variations for that embodiment. Additionally, FIG. 4 describes a state diagram of an exemplary pulse generator, such as pulse generator 136 for example.

Turning to FIG. 2, it is noted that certain details and features have been left out of flowchart 200 that are apparent to a person of ordinary skill in the art. For example, a step may comprise one or more substeps as known in the art. While steps 210 through 250 indicated in flowchart 200 are sufficient to describe one embodiment of the present invention, other embodiments of the invention may utilize steps different from those shown in flowchart 200.

Referring to step 210 in FIG. 2, step 210 of flowchart 200 comprises receiving an analog input signal. As shown in FIG. 1, driver stage 110 may receive input signal 102, which can be an analog signal, for example. Although illustrated as an analog input signal for the purpose of brevity, the received signal need not be an analog signal, and could be, for example, a non-analog signal containing data that requires pulse-width-modulated amplification. A sample analog input signal is illustrated in FIG. 3A as input signal 302 having a voltage varying with time. Input signal 302 may be seen to correspond to input signal 102, in FIG. 1.

Moving to step 220 of flowchart 200, step 220 comprises providing a modulated reference signal corresponding to the analog input signal in a feed-forward path. Consistent with FIG. 1, modulated reference signal generator 122 may provide modulated reference signal 128 corresponding to input signal 102. In this embodiment, ramp-up and ramp-down signals are used as reference signal. For the remainder of the present discussion, ramp signals and reference signal will be used equivalently in the interests of brevity. Optional PWM processor 114 may be used to modulate input signal 102 into feedforward control signal 118, which can be a crudely pulse-width-modulated representation of input signal 102. An exemplary pulse representation of feedforward control signal 118 in FIG. 1 is shown as signal 318 in FIG. 3A, which is pulse-width-modulated signal of input signal 302. Feedforward control signal 318 has rising edges at times t1 and t6, and falling edges at times t2 and t5.

Continuing with step 220 of flowchart 200 and continuing to refer to FIG. 1, reference signal generator 124 may produce modulated ramp signal 128 with a ramp-up component and a ramp-down component, which are the modulated ramp signals that can be reset based on an edge of feed-forward control signal 118, or based on input signal 102. Referring once again to FIG. 3A, ramp-up component 328a may be reset at times t1 and t6, which are rising edges of feed-forward control signal 318, and subsequently begin to ramp up. Ramp-down component 328b may be reset at times t2 and t5, which are falling edges of feed-forward control signal 318, and subsequently begin to ramp down. Thus, modulated reference signal generator 122 in FIG. 1 may provide modulated ramp signals 128 in response to analog input signal 102 in the feed-forward path of driver stage 110.

Referring now to step 230 of flowchart 200 in FIG. 2, step 230 comprises generating a control signal based on a comparison of the modulated reference signal, which is a ramp signal in this embodiment, and a correction signal produced by filtering a combination of the input signal and a feedback signal. As shown in FIG. 1, comparator 132 may generate control signal 134 based on a comparison of modulated ramp signal 128 and correction signal 116.

Step 230 is illustrated more fully in FIGS. 3A and 3B. As shown in graph 332 of FIG. 3A, the comparator may be configured to compare correction signal 316 to both ramp-up signal 328a and ramp-down signal 328b to produce respective control-up signal 334a and control-down signal 334b as illustrated in FIG. 3B. These control signals 334a and 334b correspond to control signal 134 in FIG. 1. Comparison may include a detection of zero-crossings between correction signal 316 and the respective modulated ramp signals.

As shown in FIG. 3B, control-up signal 334a may have falling edges at times t1 and t6 corresponding to rising edges of control signal 318; control-up signal 334a may have rising edges at times t3 and t8 corresponding to zero-crossing between ascending ramp-up signal 328a and correction signal 316. Analogously, control-down signal 334b may have falling edges at times t2 and t5 corresponding to falling edges of control signal 318; control-down signal 334b may have rising edges at times t4 and t7 corresponding to zero-crossings between descending ramp-down signal 328b and correction signal 316.

Continuing to step 240 of flowchart 200 in FIG. 2, step 240 comprises generating a pulse-width-modulated drive signal based on the rising edges of control-up signal 334a and the rising edges of control-down signal 334b. Referring to FIG. 1, pulse generator 136 may generate drive signal 148 based on the rising edges in control signal 134. Step 240 may be performed by pulse generator 136, which is generating width-modulated pulses from a sequence of control signals 134 by employing a state-machine. Pulse generator 136 can be configured to generate, for example, a positive pulse if a rising edge of control-up signal 334a is followed by a rising edge of control-down signal 334b, or a negative pulse if a rising edge of control-down signal 334b proceeds a rising edge of control-up signal 334a. There may be many cases to be considered in generating pulses like the case that a rising edge of control-up signal 334a is followed by another rising edge of control-up signal 334a, or that a rising edge of control-down signal 334b is followed by another rising edge of control-down signal 334b. In order for reliable operation of the loop, pulse generator 136 may employ a five state state-machine such as state-machine 400 in FIG. 4.

Figure 4:
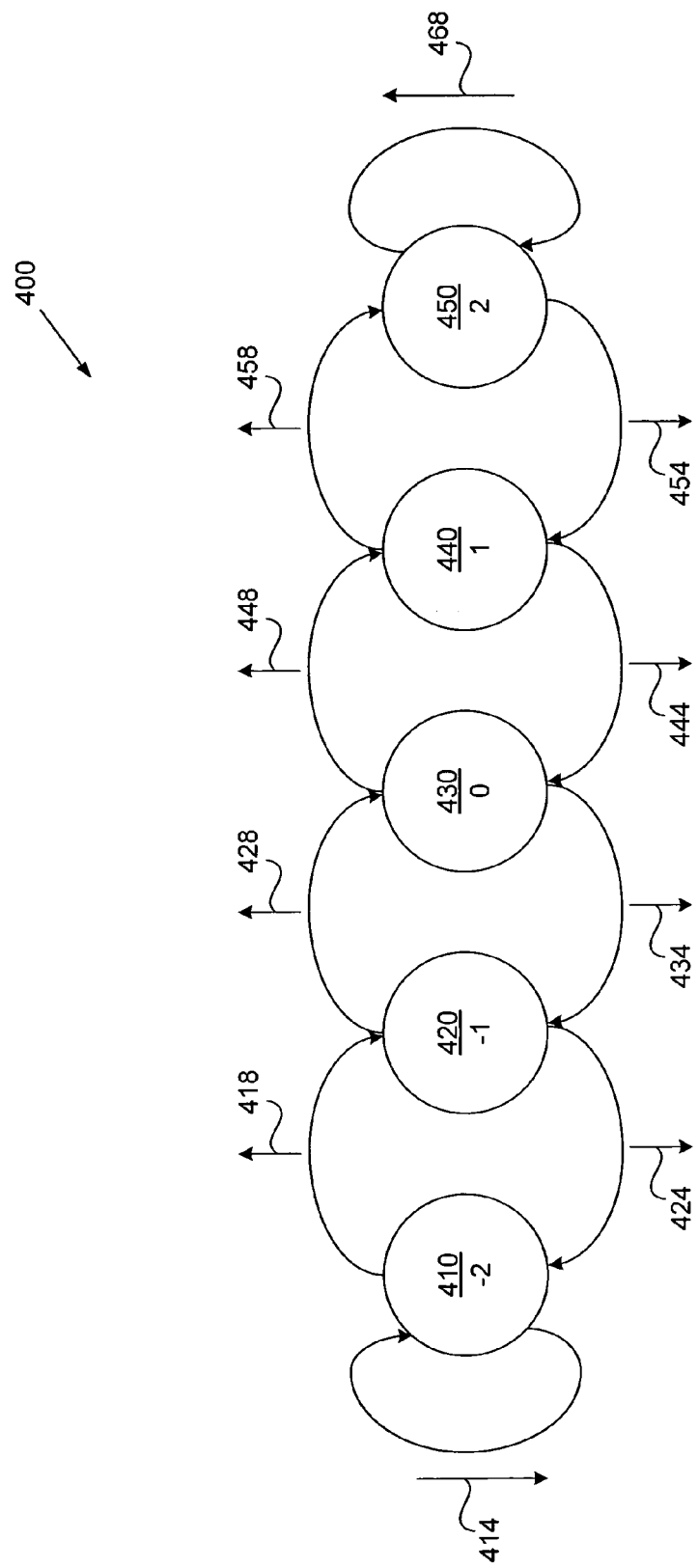
FIG. 4 is a state diagram showing states of an exemplary five-state state machine included in a class-D amplifier circuit, according to one embodiment of the present invention.

Turning to FIG. 4, state-machine 400 may comprise exemplary states that can be used by a pulse generator, such as pulse generator 136 in FIG. 1, in generating width-modulated pulses in the embodiment. Although five states are shown for simplicity, it is noted that the pulse generator may employ more or less states without departing from the inventive concept of the present invention. State-machine 400, in FIG. 4, may comprise the five states 410, 420, 430, 440, 450, and the corresponding state values are arbitrary assigned as −2, −1, 0, 1 and 2 each for description. The transition between states can be triggered by rising edges of control-up signal 334a and control-down signal 334b, for example. According to the embodiment of state-machine 400, in FIG. 4, a rising edge of control-up signal 334a, in FIG. 3B, is designated as an up-arrow, while a rising edges of control-down signal 334b is designated as a down-arrow. The output of pulse generator 136 delivers a negative value if the state value is −2 or −1, a zero value if the state value is 0, and a positive value if the state value is 1 or 2. A sequence of width-modulated three-level pulses can be generated as the output of pulse generator 136 through state-machine 400 in this embodiment.

Returning to flowchart 200 in FIG. 2 and turning to step 250 of flowchart 200, step 250 comprises driving an output stage of the class-D amplifier with the pulse-width-modulated drive signal. Taking reference to FIG. 1, drive signal 148 may drive output circuit 142 within output stage 140. Drive signal 148 may comprise a width-modulated pulse signal, including, for example, a three amplitude level pulse-width-modulated signal, and may be easily adaptable to switching transistors of output circuit 142.

The closed-loop control topology of the present invention provides good performance, including good supply noise rejection and low THD+N, over a very wide range of supply voltage fluctuations and over a wide range of input amplitudes. Because a reference signal is modulated in accordance with the input signal, loop filter output doesn't need to swing to represent the input signal. In other words, the class-D amplifier generates a pulse-width-modulated representation of the input signal even if the loop filter output doesn't swing, and the resulting headroom can be used for loop filter swinging, mostly in order to correct errors associated with supply fluctuation or circuit imperfection. As a result, the early loop saturation issues of conventional closed-loop class-D amplifiers, and the associated performance problems can be solved. Intermittent noise and poor performance parameters such as a poor THD or noisy output, all associated with open-loop topologies, are also avoided because the closed-loop configuration will correct those issues if the loop is not saturated.

According to one embodiment of the present invention, reliable operation of a closed-loop class-D amplifier can be substantially assured through the use of a five state state-machine to generate a width-modulated pulse stream. Moreover, the novel modulation scheme and other features disclosed by the present application can be configured to provide very narrow pulses if the input signal is small, providing high efficiency if the driving signal is small. As such, embodiments of the present invention enable a class-D amplifier driver to be directly connected to a battery, even in mobile applications characterized by significant supply voltage fluctuation.

From the above description of the invention it is manifest that various techniques can be used for implementing the concepts of the present invention without departing from its scope. Moreover, while the invention has been described with specific reference to certain embodiments, a person of ordinary skill in the art would recognize that changes could be made in form and detail without departing from the spirit and the scope of the invention. The described embodiments are to be considered in all respects as illustrative and not restrictive. It should also be understood that the invention is not limited to the particular embodiments described herein, but is capable of many rearrangements, modifications, and substitutions without departing from the scope of the invention.

The invention claimed is:

1. A closed-loop class-D amplifier comprising:
   a modulated reference signal generator to provide a modulated reference signal in a feed-forward path, said modulated reference signal corresponding to an input signal;
   a summer to generate an adjusted input signal by combining said input signal and a feedback signal;
   a comparator to generate a control signal based on a comparison of said modulated reference signal and a correction signal produced by filtering said adjusted input signal; and
   a pulse generator to generate a pulse-width-modulated signal to drive an output stage of said closed-loop class-D amplifier based on said control signal.

2. The closed-loop class-D amplifier of claim 1, wherein said input signal comprises an analog input signal.

3. The closed-loop class-D amplifier of claim 1, wherein said modulated reference signal comprises a ramp-up component and a ramp-down component.

4. The closed-loop class-D amplifier of claim 1, wherein said control signal comprises a combination of a control-up signal and a control-down signal.

5. The closed-loop class-D amplifier of claim 1, further comprising a feed-forward PWM processor to convert said input signal into a feed-forward control signal.

6. The closed-loop class-D amplifier of claim 5, wherein said feed-forward PWM processor comprises an analog-to-digital converter (ADC) and a digital processor for converting an output of said ADC into a digital PWM signal.

7. The closed-loop class-D amplifier of claim 5, wherein said feed-forward PWM processor comprises an analog circuitry for converting said input signal into an analog PWM signal.

8. The closed-loop class-D amplifier of claim 1, wherein said modulated reference signal comprises a ramp-up component and a ramp-down component, and wherein said ramp-up component and said ramp-down component can be reset based on one of a feed-forward control signal and responses to said input signal.

9. The closed-loop class-D amplifier of claim 1, wherein a feedback path of said class-D amplifier further comprises a feedback conditioning block.

10. The closed-loop class-D amplifier of claim 9, wherein said feedback conditioning block comprises a filter.

11. The closed-loop class-D amplifier of claim 1, further comprising a loop filter.

12. The closed-loop class-D amplifier of claim 1, wherein said pulse generator comprises a state-machine.

13. The closed-loop class-D amplifier of claim 12, wherein said state-machine comprises five states.

14. The closed-loop class-D amplifier of claim 1, wherein said modulated reference signal comprises at least one sawtooth signal.

15. The closed-loop class-D amplifier of claim 1, wherein said modulated reference signal comprises at least one triangular signal.

16. A method for generating a drive signal for a closed-loop class-D amplifier, said method comprising:
   receiving an input signal;
   providing a modulated reference signal corresponding to said input signal;
   generating an adjusted input signal by combining said input signal and a feedback signal;
   generating a control signal based on a comparison of said modulated reference signal and a correction signal produced by filtering said adjusted input signal; and
   generating a pulse-width-modulated drive signal based on said control signal.

17. The method of claim 16, wherein said input signal comprises an analog input signal.

18. The method of claim 16, wherein said modulated reference signal comprises a ramp-up component and a ramp-down component.

19. The method of claim 16, wherein generating said pulse-width modulated drive signal comprises utilizing a state-machine.

20. The method of claim 19, wherein said state-machine comprises five states.

21. The method of claim 16, wherein said providing said modulated reference signal comprises converting said input signal into a feed-forward control signal.

22. The method of claim 16, wherein said ramp-up component and said ramp-down component can be reset based on one of a feed-forward control signal and responses to said input signal.

23. A closed-loop class-D amplifier comprising:
   a modulated reference signal generator comprising a feed-forward processor and a reference signal generator, said modulated reference signal generator configured to provide a modulated reference signal;
   a summer to produce an adjusted input signal by combining an input signal and a feedback signal;
   a loop filter to produce a correction signal, said loop filter receiving said adjusted input signal;
   a drive block comprising a comparator to generate a control signal based on a comparison of said modulated reference signal and said correction signal, said drive block configured to drive an output stage of said closed-loop class-D amplifier;
   said drive block further comprising a pulse generator to drive said output stage based on said control signal.

24. The closed-loop class-D amplifier of claim 23, wherein said feed-forward processor is configured to convert said input signal into a pulse-width-modulated signal, and said reference signal generator is configured to provide said modulated reference signal based on said pulse-width-modulated signal.

25. The closed-loop class-D amplifier of claim 23, wherein said feed-forward processor comprises one of an analog-to-digital converter (ADC) and a digital-signal-processor.

26. The closed-loop class-D amplifier of claim 23, wherein said pulse generator comprises a state-machine.

27. The closed-loop class-D amplifier of claim 26, wherein said state-machine comprises five states.

28. The closed-loop class-D amplifier of claim 23, wherein said loop filter comprises a chain of integrators.

* * * * *